United States Patent

Rivera et al.

[11] Patent Number: 5,422,433
[45] Date of Patent: Jun. 6, 1995

[54] RADIO FREQUENCY ISOLATION SHIELD HAVING RECLOSABLE OPENING

[75] Inventors: Ruben Rivera, Sunrise; Timothy J. Dinwiddie, Plantation, both of Fla.

[73] Assignee: Motorola, Inc., Schaumburg, Ill.

[21] Appl. No.: 151,641

[22] Filed: Nov. 15, 1993

[51] Int. Cl.[6] .............................................. H05K 9/00
[52] U.S. Cl. .................................. 174/35 GC; 361/800
[58] Field of Search ...................... 174/35 R, 35 GC; 361/616, 727, 800, 816; 206/328; 220/337-340

[56] References Cited

U.S. PATENT DOCUMENTS

| | | | |
|---|---|---|---|
| 3,909,726 | 9/1975 | Dobrovolny et al. | 325/357 |
| 4,567,317 | 1/1986 | Ehrlich et al. | 174/35 MS |
| 4,609,104 | 9/1986 | Kasper et al. | 206/334 |
| 4,626,963 | 12/1986 | Speer | 361/424 |
| 4,641,224 | 2/1987 | Reimer | 361/424 |
| 4,822,968 | 4/1989 | Chin | 174/35 R X |
| 4,829,432 | 5/1989 | Hersberger et al. | 174/35 R X |
| 4,833,276 | 5/1989 | Ito | 174/35 R |
| 4,838,475 | 6/1989 | Mullins et al. | 228/179 |
| 5,043,848 | 8/1991 | Rogers et al. | 174/35 R X |
| 5,091,827 | 2/1992 | Juret et al. | 361/424 |
| 5,206,478 | 4/1993 | Lee | 174/35 R X |
| 5,214,241 | 5/1993 | Benwell | 174/35 GC |
| 5,235,131 | 8/1993 | Mueller et al. | 174/35 R |

Primary Examiner—Leo P. Picard
Assistant Examiner—Christopher Horgan
Attorney, Agent, or Firm—Dale W. Dorinski

[57] ABSTRACT

A shielding enclosure (10) shields an electronic circuit (12) from radio frequency interference (RFI) or electromagnetic interferences (EMI). The shielding enclosure is an electrically conductive polyhedron having at least one aperture (18). The enclosure has a closable member (20), which is a part of the polyhedron, arranged to enable the aperture to be opened and closed. The polyhedron can be an electrically conductive metal enclosure that covers the shielded circuit, and is mechanically and electrically attached to the circuit. The aperture has an integral flap (21) connected to the enclosure at one end (23), so that it is able to be opened and closed to reveal the shielded circuit. Any openings remaining in the polyhedron when the aperture is closed are less than or equal to $\frac{1}{4}$ wavelength of the interfering radio frequency energy.

12 Claims, 4 Drawing Sheets

ROADIO FREQUENCY ISOLATION SHIELD
HAVING RECLOSABLE OPENING

TECHNICAL FIELD

This invention relates in general to a shield for radio frequency interferences or electromagnetic interferences, and also to circuits having such a shield.

BACKGROUND

A major problem associated with many electronic circuits is shielding them from unwanted radiation, such as radio frequency interference (RFI) or electromagnetic interference (EMI). This need to shield high-frequency circuits, especially in electronic equipment such as two-way radios, is critical. Conventional shielding systems are generally characterized by a conductive metallic enclosure constructed to completely surround the device or circuit to be shielded. This enclosure acts either to protect the electrical equipment from external RFI or EMI signals or to prevent the escape of RFI or EMI signals generated by the device. Typically, these shielded enclosures are made from a conductive material that is electrically coupled to ground. In prior art, the shielded enclosures have been made by attaching a drawn metallic casing over the affected device(s) and soldering it to a substrate.

Unfortunately, this method of shielding makes it difficult or impossible to tune or adjust the circuit that is shielded on the interior of the metal enclosure. Circuits containing components that need to be adjusted after assembly, for example, a voltage controlled oscillator (VCO) in a two way radio, cannot be adjusted unless the shield is removed. Removing the shield then affects the circuit and changes the output, thereby rendering any adjustment questionable. Other components, such as laser trimmed resistors, cannot be adjusted without making some type of permanent opening in the shield, again degrading the shielding effectiveness. Most conventional systems try to cover the opening with a separate piece of adhesive-backed metal tape or to solder another piece of metal to the enclosure. Neither of these methods is preferred because they require additional pieces. In the case of the metal tape, the long term integrity of the closure is questionable, and in the case of the soldered patch, another soldering operation is required, exposing the circuitry to additional heat. As a result, a need exists for a method to provide RFI shielding that is economical, reliable, and does not generate excessive temperatures.

SUMMARY OF THE INVENTION

Briefly, according to the invention, there is provided a shielding enclosure to shield an electronic circuit from radio frequency interference or electromagnetic interferences. The shielding enclosure is an electrically conductive polyhedron having at least one aperture. The enclosure has a closable member, which is a part of the polyhedron, and enables the aperture to be opened and closed.

In another embodiment of the invention, an electronic circuit is shielded from radio frequency interference or electromagnetic interference. The shielded circuit comprises an electrical circuit having at least one component, formed on a circuit carrying substrate. An electrically conductive metal enclosure covers the electrical circuit and is mechanically and electrically attached to the electrical circuit. The enclosure has an opening comprising an integral flap connected to the metal enclosure at one end, the opening arranged so that it can be opened and closed to reveal the electrical circuit.

In still another embodiment, a radio receiver has an electronic circuit shielded from radio frequency interference or electromagnetic interference. The receiver comprises a circuit carrying substrate with a receive circuit on the substrate, the circuit having at least one component. An electrically conductive metal enclosure covers the receive circuit and is mechanically and electrically attached to the receive circuit. There is an opening in the metal enclosure comprising an integral flap connected at one end to the metal enclosure, and arranged to be opened and closed to reveal a portion of the receive circuit.

DETAILED DESCRIPTION OF THE PREFERRED EMBODIMENT

Figure 1:
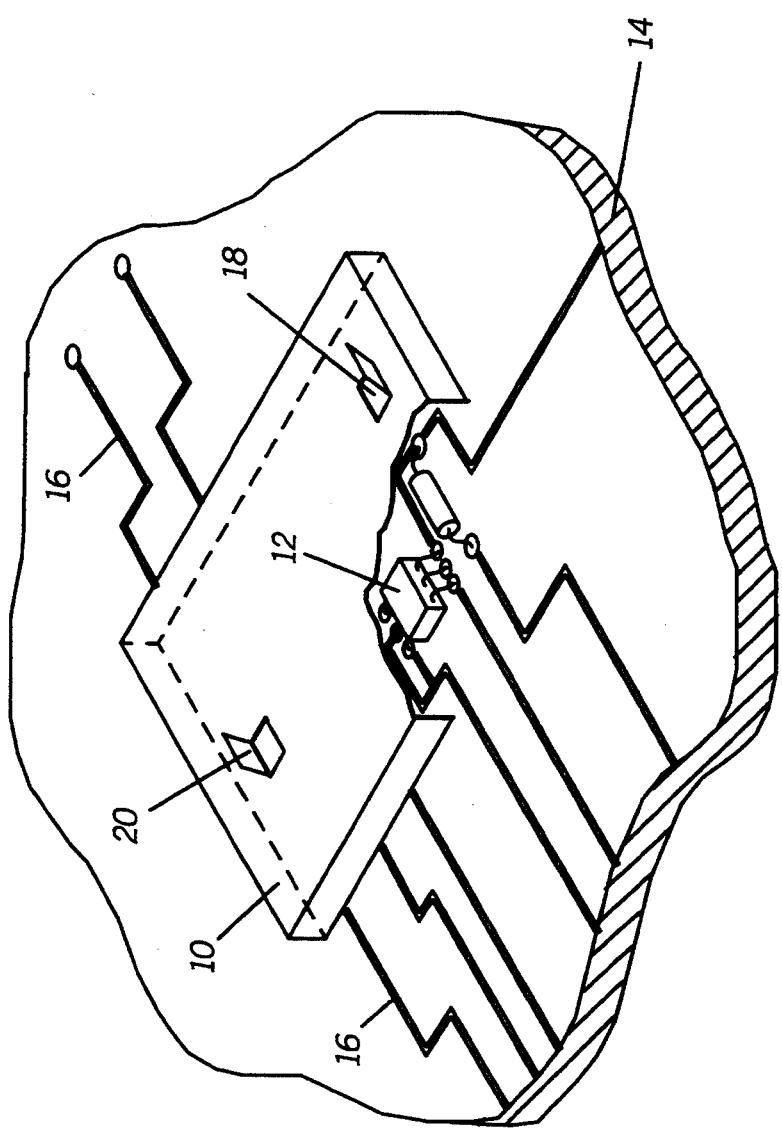
FIG. 1 is a cut-away perspective view of a circuit shielded by an enclosure in accordance with the invention.

While the specification concludes with claims defining the features of the invention that are regarded as novel, it is believed that the invention will be better understood from a consideration of the following description in conjunction with the drawing figures, in which like reference numerals are carried forward.

Referring now to FIG. 1, a cut-away perspective view of one embodiment of the invention, a shielding enclosure 10 covers at least a portion of en electrical circuit 12 that is on a circuit carrying substrate 14. The enclosure 10 can be described as an open polyhedron, that is, a casing or shell having a number of sides, each of which is a polygon. The polyhedron is described as 'open' because one side of the polyhedron is missing, to permit it to cover the electrical circuit 12 by laying on the circuit carrying substrate 14. In one embodiment, the enclosure 10 is like a box with an open bottom that is placed over the circuit 12. In the most generic embodiment, the enclosure 10 can be a hemisphere, placed over the circuit 12 with the domed side of the hemisphere facing upwards. The enclosure can be any of a number of materials, but must be electrically conductive n order to provide the electromagnetic shielding required. Materials such as sheet metal, metal foil, metal mesh, conductive polymers (intrinsically conductive or filled with conductive materials such as metals or carbon), or conductive ceramics can be used, as long as they are conductive enough to provide shielding. The enclosure 10 must also be electrically connected to the circuit, either directly, or to a ground that is coupled to the circuit. This places the enclosure at the correct electrical potential with respect to the circuit.

The circuit itself can be of numerous configurations, but typically is one that requires protection from RFI or EMI, or that emits RFI or EMI and requires that these emissions be contained. For example, computers, portable telephones, portable radios, and other communication devices have circuit components that must be shielded. In addition to the shielded circuit 12, there are also other circuitry patterns 16 on the circuit carrying substrate 14 that are not shielded. The circuit carrying substrate 14 is typically a glass reinforced laminate, but can also be other materials such as flexible circuits, ceramics, molded plastic circuits, etc.

Figure 2:
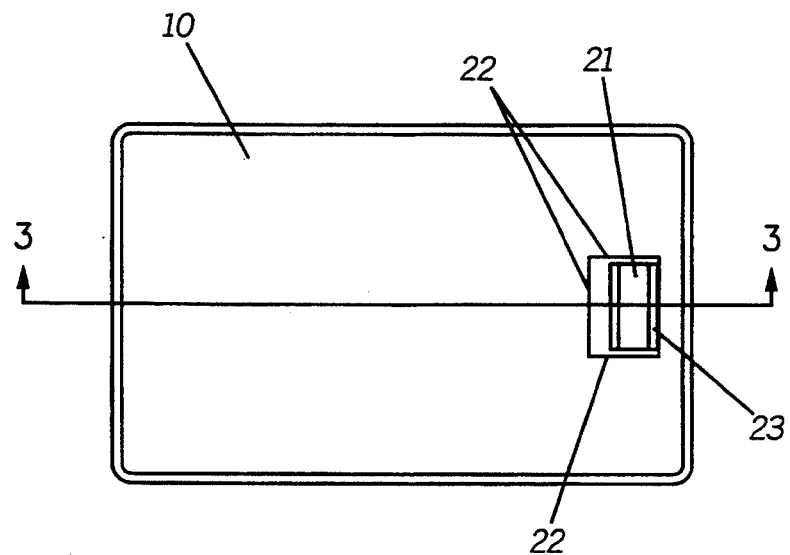
FIG. 2 is a plan view of a shield for an electronic circuit in accordance with the invention.
Figure 3:
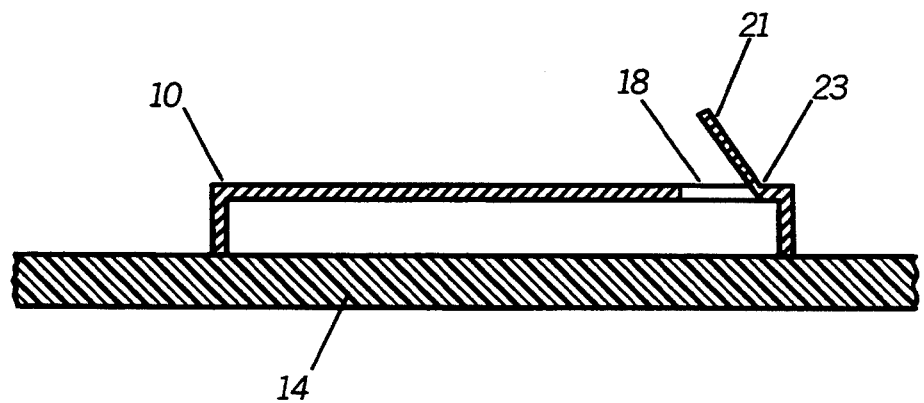
FIG. 3 is a cross sectional view of FIG. 2 through section 3—3.

Typically, there is one part of the circuit 12 that needs to be adjusted or tuned while it is shielded. Some prior art practitioners have tuned or adjusted the circuit before adding the shield, but this is not satisfactory with sensitive components. The enclosure 10 has at least one opening or aperture 18 that serves to provide access to the tunable portion of the electrical circuit 12. The opening 18 has a closable member 20 that can be operably opened and closed to reveal the tunable portion of the circuit 12. In the preferred embodiment, the closable member 20 is a flap that is an integral part of the enclosure 10. To further define, FIG. 2 shows the flap 21 is created by punching the enclosure in a three sided pattern 22 in order to form a tab. The fourth side is not punched, and forms a living hinge 23 about which the flap or tab is opened and closed. The punching should be performed so that any openings remaining in the enclosure 10 after the closable member 20 is closed are less than or equal to one (1) wavelength of the frequency of the signal or noise that is being shielded. Most preferably, the opening should be less than one fourth ($\frac{1}{4}$) of the selected wavelength. FIG. 3 shows a side view of the embodiment shown in FIG. 2, where more detail on the operation of the closable member can be seen. In this view, the flap 21 is in the open position, allowing the circuit to be trimmed or adjusted, for example, by a laser beam projected through the opening 18. When the adjusting operation is complete, the flap 21 is closed by pushing it downward, so that it rotates about the living hinge 23.

Figure 4:
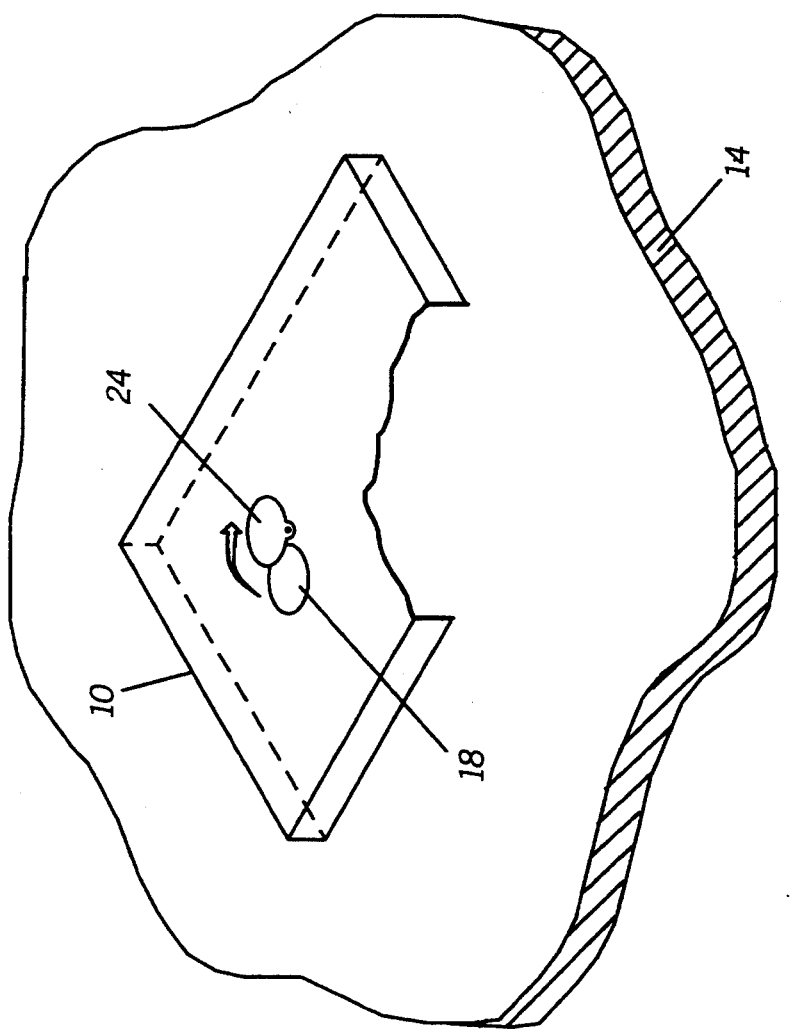
FIG. 4 is a partial plan view of an alternate embodiment of the invention.
Figure 5:
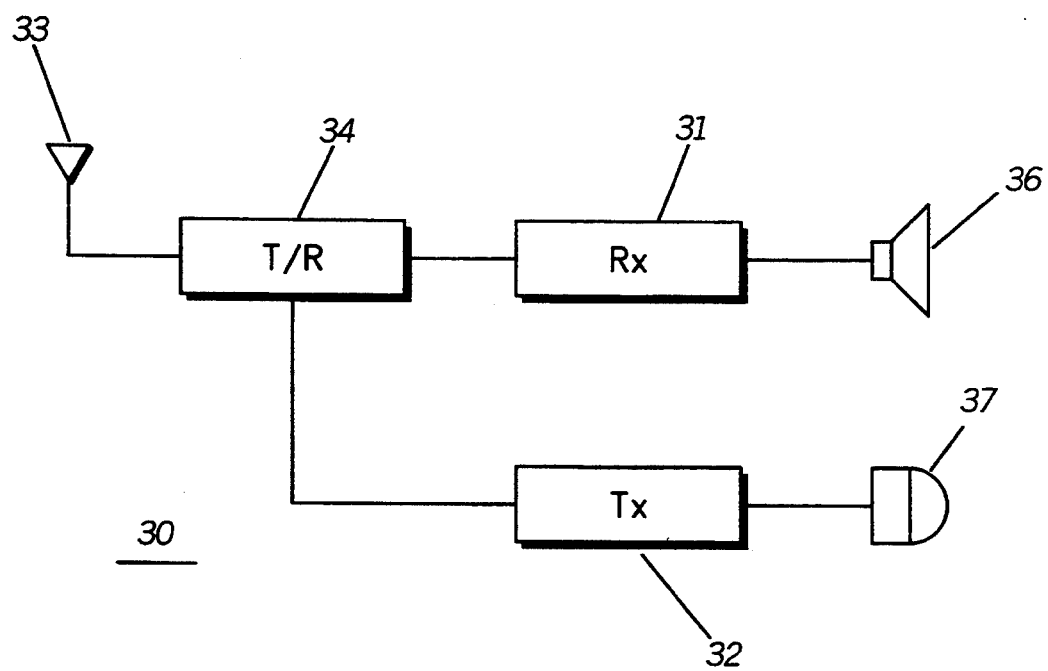
FIG. 5 is a schematic block diagram of a radio in accordance with the present invention.

Other embodiments of the invention incorporate a shutter or sliding member as the closable member. Each of these embodiments can take various forms, for example, the slider can be similar in concept to that of a sliding patio door that slides on rails to create an opening. A shutter 24 can be one or several pieces of material that rotate about one side of the opening 18, similar to a camera iris or shutter, as shown in FIG. 4. Having illustrated the concept of the invention, numerous other ways of making an aperture that can be operably opened and closed may occur to those skilled in the art.

In a further embodiment of the invention, the shielding enclosure as described herein may find particular use in portable communications applications. Referring to FIG. 3, the shielding enclosure of the present invention is utilized in a radio 30 comprising any well-known radio, such as portable two-way radios manufactured by Motorola Inc., which may operate in either receive or transmit modes. The radio 30 includes a receiver section 31 and a transmitter section 32 which comprise means for communicating, that is, transmitting or receiving communication signals for the radio.

In the receive mode, the portable radio 30 receives a communication signal via an antenna 33. A transmit/receive (T/R) switch 34 couples the received communication signal to the receiver 31. The receiver 31 receives and demodulates the received communications signal and presents its audio component to a speaker 36. It may be appreciated by one of ordinary skill in the art that other functions not herein described may be provided by any suitable means, including a controller means (not shown), which controls the entire operation of the radio 30.

In the transmit mode, audio messages are coupled from a microphone 37, where they are used to modulate a carrier signal as is well-known in the art. The modulated carrier signal is then applied to the antenna 33 through the T/R switch 34 for transmission of the communication signal. It may be appreciated that the shielding enclosure, according to the principals of the present invention, may be utilized in suitable sections of the transmitter or receiver sections 32 and 31, respectively.

As described herein, the instant invention allows one to trim, tune, or otherwise adjust an electrical circuit contained in a shield. It eliminates the need for extraneous pieces such as metal tape or solderable tabs, and provides a redosable opening in the shield at little or no extra cost. The opening can be repeatedly opened and dosed, while still providing effective shielding for the circuit.

While the preferred embodiments of the invention have been illustrated and described, it will be clear that the invention is not so limited. Numerous modifications, changes, variations, substitutions and equivalents will occur to those skilled in the art without departing from the spirit and scope of the present invention as defined by the appended claims.

What is claimed is:

1. An electronic circuit shielded from radio frequency interference or electromagnetic interferences, comprising:

a circuit carrying substrate;

an electronic circuit on the substrate, having a plurality of components;

an electrically conductive polyhedron covering at least a portion of the electronic circuit and said components, and mechanically attached to the circuit carrying substrate and electrically attached to the electronic circuit, the polyhedron having at least one aperture arranged to reveal only a portion of the plurality of components; and the electrically conductive polyhedron having a closable member arranged to enable the aperture to be opened and closed, the closable member being a part of the polyhedron.

2. The electronic circuit as described in claim 1, wherein the closable member is a shutter.

3. The electronic circuit as described in claim 1, wherein the closable member is a sliding member.

4. The electronic circuit as described in claim 1, wherein the closable member is arranged so as to permit the electronic circuit to be adjusted and remain electrically shielded when the aperture is open.

5. The electronic circuit as described in claim 1, wherein the closable member is a flap that is an integral part of the polyhedron.

6. The electronic circuit as described in claim 1, wherein any openings remaining in the electrically conductive metal enclosure when the closable member is closed are less than or equal to $\frac{1}{4}$ wavelength of said radio frequency interference.

7. An electronic circuit shielded from radio frequency interference or electromagnetic interference, comprising:

a circuit carrying substrate;

an electronic circuit on the substrate, having a plurality of components;

an electrically conductive metal enclosure covering at least a portion of the electronic circuit and mechanically attached to the circuit carrying substrate and electrically attached to the electronic circuit, the enclosure having at least one side; and an opening in the metal enclosure, the opening comprising an integral flap connected to the metal enclosure at one end, and arranged to be operably opened and closed to reveal only a portion of the electronic circuit covered by the metal enclosure.

8. The electronic circuit as described in claim 7, wherein the electrically conductive metal enclosure is a hemisphere.

9. The electronic circuit as described in claim 7, wherein any openings remaining in the electrically conductive metal enclosure when the integral flap is closed are less than or equal to ¼ wavelength of said radio frequency interference.

10. The electronic circuit as described in claim 7, wherein the opening is arranged so as to permit the electronic circuit to be adjusted and remain electrically shielded when the aperture is open.

11. A radio, comprising a receiver, said receiver having a receive circuit shielded from radio frequency interference or electromagnetic interference, comprising:

a circuit carrying substrate having said receive circuit on the substrate, said circuit having at least one component;

an electrically conductive metal enclosure covering only said receive circuit and mechanically attached to the circuit carrying substrate and electrically attached to said receive circuit;

an opening in the metal enclosure, the opening comprising a closable member arranged to enable the opening to be opened and closed to reveal only a portion of the receive circuit.

12. The radio as described in claim 11, wherein the opening in the metal enclosure is arranged so as to permit the receive circuit to be adjusted and remain electrically shielded when the opening is open.

* * * * *